United States Patent [19]
Schutyser et al.

[11] Patent Number: 5,821,305
[45] Date of Patent: Oct. 13, 1998

[54] ALLYL-CONTAINING EPOXY RESIN COMPOSITION COMPRISING A COPOLYMER OF AN ETHYLENICALLY UNSATURATED ANHYDRIDE AND A VINYL COMPOUND

[75] Inventors: Jan Andre Jozef Schutyser, Dieren; Antonius Johannes Wilhelmus Buser, Wehl, both of Netherlands

[73] Assignee: Akzo Nobel NV, Arnhem, Netherlands

[21] Appl. No.: 776,753

[22] PCT Filed: Sep. 7, 1995

[86] PCT No.: PCT/EP95/03523

§ 371 Date: May 12, 1997

§ 102(e) Date: May 12, 1997

[87] PCT Pub. No.: WO96/07683

PCT Pub. Date: Mar. 14, 1996

[30] Foreign Application Priority Data

Sep. 8, 1994 [NL] Netherlands ............... 9401461

[51] Int. Cl.$^6$ .............. C08L 63/02; C08L 63/04
[52] U.S. Cl. ............... 525/112; 525/109
[58] Field of Search ............... 525/112, 109

[56] References Cited

U.S. PATENT DOCUMENTS

| | | | |
|---|---|---|---|
| 2,707,177 | 4/1955 | Skiff et al. | 260/30.6 |
| 4,056,506 | 11/1977 | Heilman et al. | 260/42.18 |
| 4,591,623 | 5/1986 | Nakajima et al. | 525/524 |
| 5,210,157 | 5/1993 | Schutyser et al. | 525/502 |
| 5,352,745 | 10/1994 | Katayose et al. | 525/396 |
| 5,728,468 | 3/1998 | Schutyser et al. | 525/529 |

FOREIGN PATENT DOCUMENTS

| | | |
|---|---|---|
| 627887 | 5/1963 | Belgium . |
| 413 386 | 2/1991 | European Pat. Off. . |
| 417 837 | 3/1991 | European Pat. Off. . |
| 715636 | 6/1996 | European Pat. Off. . |
| 35 21 506 | 12/1985 | Germany . |
| 4-015211 | 1/1992 | Japan . |
| 4-44287 | 2/1992 | Japan . |
| 1165703 | 7/1985 | U.S.S.R. . |
| 994484 | 6/1965 | United Kingdom . |
| WO 85/03515 | 8/1985 | WIPO . |
| WO 86/02085 | 4/1986 | WIPO . |

OTHER PUBLICATIONS

"Liquid Crystalline Polymers to Mining Applications: Maleic and Fumaric Polymers", *Encyclopedia of Polymer Science and Engineering*, 9:225–294 (1987).

*Primary Examiner*—Robert E. Sellers
*Attorney, Agent, or Firm*—Loretta A. Miraglia; Louis A. Morris

[57] ABSTRACT

The invention relates to a resin composition comprising epoxy resin, a cross linking agent for the epoxy resin in the form of a carboxylic anhydride, and at least one allyl network forming compound. According to the invention, the anhydride-functional compound is a copolymer of an ethylenically unsaturated anhydride and a vinyl compound. Notably suitable are styrene-maleic anhydride copolymers known as SMA Type 1. Surprisingly, it was found that the presence of at least 2 wt.% of triallyl cyanurate (TAC) results in an increase in Tg, such that even with simple difunctional epoxy compounds resins can be obtained which have a glass transition temperature of 130° C. and higher. It was further found that the processing as prepreg of epoxy resins cross-linked using anhydride-vinyl copolymers will be greatly enhanced by the presence of at least 10 % of allyl.

9 Claims, No Drawings

5,821,305

ALLYL-CONTAINING EPOXY RESIN COMPOSITION COMPRISING A COPOLYMER OF AN ETHYLENICALLY UNSATURATED ANHYDRIDE AND A VINYL COMPOUND

The invention pertains to a resin composition comprising epoxy resin, a cross-linking agent (curing agent) for the epoxy resin in the form of a carboxylic anhydride, and at least one allyl network forming compound.

BACKGROUND OF THE INVENTION

Such resin compositions are known from EP 413 386. This document relates to IPNs (Interpenetrating Polymeric Networks) having very favorable properties, in particular for use in the electronics industry. This is the case when the cross-linking agent used for the epoxy resin is a polyhydric phenol. In actual practice, the embodiment using anhydride cross-linking agents proves unsatisfactory. Notably, the Tg obtained is too low, and the electrical properties and the prepreg stability also leave room for improvement.

In addition, it is desired that the use of inexpensive difunctional epoxy resins should give thermal properties which are of the same standard as can be obtained using the multifunctional epoxy resins preferably employed in EP 413 386. Resins based on multifunctional epoxy compounds have been described in WO 85/03515 and WO 86/02085.

Other publications describing allyl-epoxy resin compositions employing anhydrides as cross-linking agent for the epoxy resin are U.S. Pat. No. 2,707,177, DE 35 21 506, GB 994 484, and EP 417 837. This last patent specification teaches the use of ethylenically unsaturated anhydrides, such as maleic anhydride, where the anhydride not only cross-links the epoxy resin but also takes part in the forming of the allyl network.

In JP 04-44287 and in JP 04-015211 a resin composition for flexible printed circuits is described. The resin composition comprises a phtalate based compound with at least two allyl groups per molecule, a copolymer made from ethylene and an α,β-unsaturated dicarboxylic acid and/or its anhydride, and a copolymer made from ethylene and an ethylenic unsaturated monomer containing an epoxy group. The composition described here is a specific grafted IPN. As the composition described comprises thermoplasts rather than conventional epoxy resins, this composition is not suitable for use in prepregs.

The use of adducts of ethylenically unsaturated anhydrides and aromatic acids as cross-linking agent for epoxy resin is described in BE 627 887. This patent publication also discloses a proposal to use copolymers of maleic anhydride and styrene (SMA) as cross-linking agent for epoxy resin. A drawback to such epoxy resin compositions is that they cannot be used to make so-called prepregs.

Prepregs are widely employed in the manufacture of laminates for the electronics industry, in particular for printed-wire boards. Such manufacture involves impregnating a supporting or reinforcing fabric with a resin, followed by partial curing of said resin. Such impregnated fabric is commonly referred to as prepreg. Manufacturing a printed-wire board involves laminating one or more layers of prepreg with, say, one or more layers of copper.

Processing prepregs into boards usually involves their being cut down to size and laminated. Both these process steps make stringent demands on the resin with which the fabric is impregnated. For instance, the partially cured resin has to have sufficient sturdiness and a high viscosity, yet it must be sufficiently sticky and liquid to give good adhesion when laminated, and hence good interlaminar strength. The resin may not be too highly reactive, since this will render the required partial curing impossible.

In this connection resin compositions where the epoxy resin is cross-linked with an anhydride-containing copolymer have the drawback of being too brittle to be processed as prepregs. For instance, it proves impossible to cut up such prepregs without a portion of the resin blowing about in the form of a large quantity of dry dust. This is sometimes called a "mushroom effect", after mushroom spores blowing about.

One the one hand, the invention has for its object to enhance the thermal and electrical properties of resin compositions based on allyl compounds and epoxy-resin cross-linked with anhydride. One the other, the invention envisages providing resin compositions based on difunctional epoxy resin which have thermal and electrical properties comparable to those of resin compositions based on multi-functional epoxy compounds. Furthermore, the invention aims to provide resin compositions where the problem of brittleness, which occurs when SMA is used as epoxy cross-linking agent, can be prevented.

SUMMARY OF THE INVENTION

To this end, the invention consists of a resin composition of the type mentioned in the opening paragraph where the carboxylic anhydride is a copolymer of an ethylenically unsaturated anhydride and a vinyl compound. In such a copolymer the ethylenically unsaturated portion of the anhydride is incorporated into the backbone. The carboxylic anhydride groups remain intact, and they are available as functional groups for cross-linking the epoxy resin.

DETAILED DESCRIPTION OF THE INVENTION

Examples of suitable ethylenically unsaturated anhydrides include maleic anhydride, fumaric anhydride, itaconic anhydride, citraconic anhydride. Examples of suitable vinyl compounds include ethylene, propylene, butylene, isobutylene, styrene, α-methyl styrene. Copolymers of maleic anhydride have been described, int. al., in *Encyclopedia of Polymer Science and Engineering* Vol. 9 (1987), page 225 ff. Within the framework of the invention the term "copolymer" likewise refers to polymers into which mixtures of unsaturated anhydrides and/or mixtures of vinyl monomers have been incorporated (e.g., terpolymers of maleic anhydride, ethylene, and styrene).

Preference is given to copolymers of styrene and maleic anhydride (SMA), which are commercially available in two types. Type 2 comprises mostly high-molecular weight terpolymers (MW generally higher than 100,000, e.g., 1,000,000). These are in fact thermoplasts, which are unsuitable for use in the manufacture of prepregs. Moreover, because of their low anhydride content (5–15%) they are not particularly suitable for use as a cross-linking agent for epoxy resin either. The type 1 SMA copolymers, on the other hand, which have a molecular weight in the range of about 1500 to about 50,000 and an anhydride content of more than 15%, are pre-eminently suited to be used. Preference is also given to SMA copolymers having a molecular weight in the range of 1500 to 10,000. Examples of such copolymers include the commercially available SMA 1000, SMA 2000, and SMA 3000. These copolymers have a styrene:maleic anhydride weight ratio of 1:1, 2:1, and 3:1, respectively, and a molecular weight ranging from about 1400 to about 2000.

The amount of copolymer employed can be such as will give an anhydride:epoxy equivalency ratio in the range of 30 to 110%. When using 20 wt.% or more of allyl compound, the ratio selected preferably is between 75 and 100%. When using less than 10 wt.% of allyl compound, the preferred anhydride:epoxy ratio ranges from 40 to 60 equivalent %.

In addition to the copolymeric cross-linking agent there may be used a polyhydric phenol cross-linking agent. Examples of polyfunctional aromatic hydroxyl compounds include dihydroxy compounds of the formulae shown in U.S. Pat. No. 5,210,157. Furthermore, Novolac resins such as phenol/-formaldehyde, cresol/formaldehyde or phenol/p-hydroxybenzaldehyde can function as polyfunctional aromatic hydroxyl cross-linking agents. The anhydride/vinyl copolymer can also be combined with other types of epoxy cross-linking agents, such as amine-containing cross-linking agents (e.g., dicyanodiamide) and low-molecular weight anhydrides (e.g., methyl tetrahydrophthalic anhydride, methyl hexahydrophthalic anhydride, nadic methyl anhydride, hexahydrophthalic anhydride, benzophenone tetracarboxylic anhydride, tetrahydrophthalic anhydride). The selection of an additional cross-linking agent applies in particular when extra flame retardancy is desired. Preferred in this connection is tetrabromo bisphenol-A. The additional cross-linking agent will generally be used in such an amount as to give a copolymer:phenol equivalency ratio of 90:10 to 10:90, preferably of 90:10 to 40:60.

The term "epoxy resin" in this context refers to a curable composition of oxirane ring-containing compounds as described in C.A. May, *Epoxy Resins*, 2nd Edition, (New York & Basle: Marcel Dekker Inc.), 1988.

Examples of epoxy resins include phenol types such as those based on the diglycidyl ether of bisphenol-A, on polyglycidyl ethers of phenol-formaldehyde Novolac or cresol-formaldehyde Novolac, on the triglycidyl ether of tris(p-hydroxyphenyl)methane, or on the tetraglycidyl ether of tetraphenyl ethane; amine types such as those based on tetraglycidyl methylene dianiline or on the triglycidyl ether of p-aminoglycol; cycloaliphatic types such as those based on 3,4-epoxycyclohexylmethyl-3,4-epoxycyclohexane carboxylate. The term "epoxy resin" also stands for reaction products of compounds containing an excess of epoxy (e.g., of the aforementioned types) and aromatic dihydroxy compounds. These dihydroxy compounds may be halogen substituted.

Preference is given to epoxy resins of the phenol type, especially on account of their low price. This holds particularly for epoxy resins based on difunctional epoxy compounds such as bisphenol-A bisepoxide and other diglycidyl ethers (such as the diglycidyl ether of bisphenol-F, sulphon diphenol, tetrabromobisphenol-A). As a rule, the glass transition temperature of such bisepoxides does not exceed about 120° C. A significant advantage of the resins according to the present invention lies in the fact that the combination of anhydride-vinyl copolymers as cross-linking agent and the presence of at least 2 wt.% of triallyl cyanurate (TAC) results in a much higher Tg (130°–190° C.) being obtained, while resin proccessability continues to be excellent.

It is possible to introduce fire retardancy not just into the cross-linking agent but also into the resin itself, usually by means of incorporating halogenated compounds. Thus tetrabromobisphenol-A in particular is a well-known component of epoxy resins suitable for use in the present invention.

It should be noted that epoxy resins are generally represented by a single, unequivocal structural formula. The skilled person will know that this should be taken to include deviating products resulting from side reactions occurring during epoxy resin preparation. As these side products constitute a normal component of cured epoxy resins, they likewise constitute a normal component of the resins according to the invention.

Cross-linking of the epoxy resin generally proceeds with the aid of an accelerator. As suitable accelerators may be mentioned imidazoles, more particularly alkyl substituted imidazoles such as 2-methyl imidazole and 2-ethyl-4-methyl imidazole, and tertiary amines, e.g., benzyl dimethyl amine.

The amount used of such an accelerator is dependent on the type of epoxy resin, the type of cross-linking agent, and the type of accelerator. Employing a too large amount of accelerator will lead to a too highly reactive resin system. Such a system is not serviceable for making prepregs. The skilled person can easily determine within which range a resin system will be just sufficiently little reactive to allow ready processing into prepregs. In general, such a processing range will be between 0.01 and 5 wt.% of accelerator, calculated on the overall weight of epoxy resin and cross-linking agent. In many cases this will be the 0.01-0.075 wt.% range. The gel time for its part is dependent on the type and amount of accelerator, the type and amount of solvent, and the type of prepreg to be manufactured. In the specific case of 2-methyl imidazole (2MI) being used as accelerator and SMA copolymers serving as cross-linking agent, it is preferred not to use more than about 0.025 wt.% of 2MI. By way of general guideline it can be said that it is advisable not to have a system gel time of less than 120 seconds.

Examples of suitable allyl monomers formed into an allyl polymer network via cross-linking under the influence of radicals include triallyl cyanurate (TAC), triallyl isocyanurate (TAIC); aromatic polyallyl esters such as diallyl phthalate, diallyl isophthalate, triallyl trimellitate, tetraallyl pyromellitate, diallyl tetrabromophthalate; aliphatic polyallyl esters such as diallyl adipate, diallyl maleate, diallyl fumarate, and polyallyl carbonates such as diethylene glycol diallyl carbonate.

Alternatively, mixtures of allyl monomers and allyl prepolymers may be employed to prepare resins according to the invention.

The polyallyl compounds in the resin can be partially replaced by aromatic difunctional methacrylates, such as described in U.S. Pat. No. 5,210,157. Preferably, use is made of 2,2-di(4-methacryloxy-ethoxyphenyl)propane (BMEPP).

The desired resin properties determine the amount of allyl to be incorporated into the resin and the type of allyl compound. According to the invention, for instance, it has surprisingly been found that the Tg of epoxy resins cross-linked with the aid of copolymers of maleic anhydride and vinyl compounds (such as SMA) can be increased substantially by the use of at least 2% of triallyl cyanurate (TAC). This is even the case when apart from the TAC (preferably 2–20%) there are no other allyl compounds. The Tg effect found is such, however, as to increase the Tg of every epoxy resin. Most surprisingly of all, it is now possible, as indicated above, to obtain resins having glass transition temperatures of 130° C. and higher even with simple difunctional epoxy compounds.

A further surprising result according to the invention consists in that the incorporation into the resin of at least 5%, and preferably more than 10%, of any allyl compound will give resins where the use of anhydride copolymer cross-linking agents does not produce a mushroom effect. Preferably, 10–60 wt.% of allyl is used. Optimum results, i.e., those which produce both a higher Tg and good prepreg proccessability, are attained with at least 10 wt.% of TAC present in the resin.

It should be noted that even when the amount of allyl is low (say, 2–5% of TAC), the resin according to the invention differs substantially from the epoxy resin in its unmodified form. In this connection it has to be considered surprising that a major epoxy resin property, i.e., the Tg, is increased so strongly at the much lower TAC contents mentioned. At a higher allyl content the resin according to the invention will differ from the epoxy resin to a greater extent. The allyl compounds are always used in conjunction with a radical initiator, and so will form a polymer network not chemically bonded to the epoxy network. As a rule, it tends to be very evident in this connection that at allyl contents of more than 10 wt.% there is question of an IPN (interpenetrating polymer network): in the (at least partially) cured form the resin according to the invention in that case will comprise an intimate physical interlinking, on a molecular scale, of the two chemically differing networks. This results in a single Tg and the enhancement of several key properties, such as resistance to chemicals, dielectrical properties, and prepreg flexibility.

In general, the initiator is used in a ratio of 0.1–5 wt.% vis-à-vis the allyl compound. Suitable initiators include peroxides, such as t-butyl peroxybenzoate, t-butyl peroxy-3,5,5-trimethyl hexanoate, and benzoyl peroxide. Alternatively, thermal polymerisation can be carried out without an initiator.

As a rule, an organic solvent is employed when preparing resins according to the invention. One advantage of the use of TAC as IPN component is that is can also act as a solvent. If an additional solvent is used, it must be one in which the epoxy resin, cross-linking agent, and polyallyl compound are soluble, while the solvent itself should be sufficiently volatile to evaporate before or during the partial curing of the IPN, or else before its final curing.

As suitable solvents may be mentioned dimethyl formamide; glycol ethers such as ethylene glycol mono-ethyl ether or propylene glycol mono-ethyl ether and their esters such as ethylene glycol mono-ethyl ether acetate; ketones such as methyl isobutyl ketone, methyl ethyl ketone, acetone, and methyl isopropyl ketone; aromatic hydrocarbons such as toluene and xylene. Alternatively, mixtures of solvents can be employed. The preferred solvents are ketones, notably acetone and methyl ethyl ketone or mixtures of these with ethers, notably propylene glycol mono-ethyl ether.

The invention further pertains to laminates for use in the electronics industry incorporating resins of the aforementioned type.

Laminates for use in the electronics industry (particularly for printed-wire boards) are generally produced by impregnating a supporting or reinforcing material (usually based on glass fibres, either as a woven fabric or in the form of a cross-ply laminate of unidirectionally oriented parallel filaments) with a resin, followed by the resin being cured wholly or in part. The latter process is the most common one, and a fabric impregnated with a partially cured resin is usually referred to as a "prepreg." To make a printed-wire board from a prepreg fabric one or more layers of the prepreg are laminated with, say, one or more layers of copper.

The resin used generally is an epoxy resin. The present practical standard is the FR4-laminate, which is based on a brominated epoxy resin prepared from a diglycidyl ether of bisphenol-A and tetrabromo-bisphenol-A, dicyanodiamide as curing agent, an organic solvent, an accelerator, and a catalyst. The drawback to such an epoxy resin is its low Tg (110°–135° C.), while in addition the dicyanodiamide has a tendency to crystallize in the resin and the prepreg made therefrom.

The resins according to the invention are highly suitable for impregnating, e.g., woven fabric and cloth of a variety of materials such as glass, quartz, carbon, aramid, and boron fibres, more particularly to make laminates for printed-wire boards. This application preferably calls for the resin to be employed in combination with a glass fabric.

It was found that even when it is based on simple difunctional epoxy compounds, the combination of resin components according to the invention will give excellent properties for application in the electronics industry. The Tg effect has been mentioned earlier: as compared with the corresponding standard epoxy resins (cured with dicyanodiamide) TAC-containing resins according to the invention have a Tg of about 30°–50° C. higher. Furthermore, it was found that resins according to the invention exhibit a much better resistance to short, intense temperature increases than do standard FR4 epoxy resin and IPNs according to EP 413 386. This is demonstrated by the solder shock test, which is known to the skilled man. In this test a material is transferred abruptly from room temperature to solder having a temperature of 288° C. The material (in this case a laminate made of a resin according to the invention) floats in the solder, and so will be subject to a temperature gradient (and hence a tension gradient). The material should be capable of withstanding these conditions for at least 30 seconds without bubble formation or delamination occurring. The longer the material can stand the test, the more serviceable it will be for use in printed-wire boards. The resins according to the invention are capable of standing the solder shock test for 10 minutes, which represents a substantial improvement over both the aforementioned known IPNs, which bear it for about 3 minutes, and FR4 epoxy resin (about 4 minutes). Furthermore, the resins according to the invention exhibit a significant reduction of dielectric loss. Measured at 1 MHz (in accordance with IPC TM-650, 2.5.5.1), the resins according to the invention give a value of $10–11\times10^{-3}$, as compared with $20–25\times10^{-3}$ for FR4 epoxy and $15–20\times10^{-3}$ for IPNs according to EP 413 386.

Also, the resins according to the invention can be employed wherever use is made of conventional epoxy resins: as a glue, coating, molding resin, embedding resin, encapsulating resin, sheet molding compound, bulk molding compound.

In addition to being used as composites for printed-wire boards, the IPN-resins according to the invention can be employed to make composites for, int. al., the construction, aviation, and automobile industries. The manufacture of appropriate structural composites may proceed in a known manner, e.g., by impregnating reinforcing material with molten or dissolved resin, or via resin transfer molding, filament winding, pultrusion, or RIM (reaction injection molding).

The resins according to the invention may contain the usual additives such as dyes or pigments, thixotropic agents, fluidity control agents, and stabilizers.

EXAMPLES

The invention will be further illustrated with reference to the following unlimitative examples.

Example 1

(Comparison example)

An epoxy resin composition was prepared as formulated below: 45.5 g of Epikote 1143B80 (FR-4 resin, ex Shell, epoxy equivalent weight 500, 21 wt.% of bromine, 80% solution in methyl ethyl ketone) were combined with 26.6 g of SMA3000 (ex Elf Atochem, MW average 2870). This quantity of solid SMA3000 had earlier been dissolved in 26.6 g of methyl ethyl ketone (MEK). Next, 158 mg of a 10%-solution of 2-methyl imidazole (in 2-methoxy,1-propanol) were added (0.025 %, calculated on the solid resin components, i.e., solid FR-4 and SMA combined). The resin now contained 0.131 equivalents of epoxy groups and 0.118 equivalents of anhydride groups. The stoichiometry percentage (simply, equivalent percentage), i.e., the ratio of the number of equivalents of anhydride groups divided by the number of equivalents of epoxy groups multiplied by 100, was 90,3%.

This resin solution was poured into aluminum molds. Enough resin was used to give a thickness after curing of 0.5 to 1 mm. The samples were placed in a forced-circulation air oven. The temperature of the oven was set to 80° C. This temperature was maintained for about 1 hour, raised in about 30 minutes to 120° C., and maintained for 30 minutes before being raised again, this time to 180° C. in about 45 minutes. It was kept at 180° C. for 1 hour. On conclusion of this cycle the samples were cooled down slowly to room temperature, released from the molds, and subjected to a thermal treatment at 200° C. for 2 hours.

Example 2

A mixture of the following resin components was prepared: 45.5 g of Epikote 1143B80, 26.6 g of SMA3000 (dissolved in an even amount of MEK), and 10.0 g of TAC-prepolymer solution (70% in MEK). The resin contained 0.072 equivalents of epoxy groups and 0.065 equivalents of anhydride groups. The equivalent percentage equalled that of Example 1: 90.3%. In terms of percentages by weight, the composition of the formulation was as follows: 52.0 wt.% of FR-4, 38.0 wt.% of SMA3000, and 10.0 wt.% of TAC. The TAC-prepolymer solution had the following characteristics: Mw=143000, Mn=7100, dispersion of 20.1, conversion from the monomer to the oligomer of 43%, solids content of 70%, and a Brookfield viscosity of 60 Mpa.s.

To the solution were added successively: 158 mg of a 2-methyl imidazole solution (10 g of 2-methyl imidazole dissolved in 90 g of 2-methoxy,1-propanol) and 70 mg of tert.-butyl peroxybenzoate. Curing took place as described in Example 1.

Example 3

In a manner analogous to that described in Examples 1 and 2 a resin was formulated and cured. This formulation contained only 3 wt.% of TAC. The remainder of the composition, in percent by weight and calculated on solids, was as follows: 41.0% of SMA3000 and 56.0% FR-4 resin. The following amounts were weighed in: 49.0 g of Epikote 1143B80, 28.7 g of SMA3000 (dissolved in an even amount of MEK), 3.0 g of TAC-prepolymer solution, 170 mg of 2MI-solution (10% in 1-methoxy,2-propanol), i.e., 0.025% calculated on FR-4 and SMA combined, 21 mg of t.-butyl peroxybenzoate, i.e., 1% vis-à-vis TAC. The formulation contained 0.078 equivalents of epoxy and 0.070 equivalents of anhydride, giving an equivalent percentage of 89.7%.

Example 4

The same formulation except with 5 wt.% of TAC had the following composition: 48.0 g of Epikote 1143B80 (54.8 wt.%), 28.1 g of SMA3000 (dissolved in 28.0 g of MEK) (40.2 wt.%), 5.0 g of TAC-prepolymer solution (5.0 wt.%).

For 0.025% of 2MI (relative to the solid epoxy components, FR-4 and SMA): 166 mg of a 10% solution. One percent of t-butyl peroxybenzoate in this case was 35 mg. The equivalent percentage was 89.9%.

Example 5

An example containing 20 wt.% of TAC, analogous to the formulations discussed above. The following quantities were employed:

40.4 g of Epikote 1143B80 (46.2 wt.%);

23.7 g of SMA3000 (dissolved in an even amount of MEK) (33.8 wt.%);

20.0 g of TAC-prepolymer solution;

140 mg of 2-methyl imidazole solution (10%);

0.025 % of 140 mg of t.-butyl peroxybenzoate, 1% vis-à-vis TAC solids;

The equivalent percentage was 90.3%.

The properties of the samples obtained as disclosed in Examples 1 through 5 are compiled in Table 1.

TABLE 1

[Tg-measurements on the samples described in Examples 1 through 5]
SMA3000
equivalent percentage 90%
0.025% of 2-methyl imidazole

| example no. | 1 (comp.ex) | 3 | 4 | 2 | 5 |
|---|---|---|---|---|---|
| composition: | | | | | |
| % FR-4 resin | 57.7 | 56.0 | 54.8 | 52.0 | 46.2 |
| % SMA3000 | 42.3 | 41.0 | 40.2 | 38.0 | 33.8 |
| % TAC | 0 | 3.0 | 5.0 | 10.0 | 20.0 |
| Tg (°C.) TMA-method | 100 | 110 | 135 | 185 | 165 |

Example 6

The resin of the composition indicated in Example 2 was used to make prepregs and laminates, the amounts of accelerator and t-butyl peroxybenzoate being changed, however, to 0.035% of 2-methyl imidazole vis-à-vis epoxy and SMA-solids and 3% of t-butyl peroxybenzoate vis-à-vis TAC-solids, respectively.

The composition of this resin solution was as follows:

1500 g of Epikote 1143B80
330 g of TAC-prepolymer (70% in MEK)
1758 g of SMA3000 solution (50% in MEK)
500 g of MEK
50 g of 2-methoxy,1-propanol
7.58 g of 2-methyl imidazole solution (0.758 g of solid 2-methyl imidazole supplemented with 2-methoxy,1-propanol to 7.58 g)
6.9 g of t-butyl peroxybenzoate The Brookfield viscosity was 100 mPa.s.

Standard E-glass, style 7628 with finish Z6032, was impregnated with this resin using a laboratory treater. This process involved glass fabric of a width of about 50 cm being passed continuously through a vessel containing resin solution. The fabric saturated with resin was then placed in a drying tunnel, where the solvent evaporated in the first section and the temperature moved through a gradient from 50° to 170° C. In the second treater section, with the temperature at 170° C., the resin, which was now solventfree, was partially polymerized. This polymerisation stage is usually referred to as the B-stage, the material is called a prepreg. The viscosity of the resin and the set speed of the treater resulted in a prepreg having the following characteristics: resin yield 44–48 wt.% and resin flow 19–24%. These values were determined in accordance with test procedures drawn up by the IPC (Institute for Interconnecting and Packaging Electronic Circuits).

In a hydraulic press equipped with a vacuum chamber the thus prepared prepregs were compressed to form a laminate. To this end 8 prepregs of 50×50 cm were deposited on copper foil (1 ounce, electrodeposited type). Copper foil was also placed on top of the package, and the whole was then transferred to said press. The specific pressure during the compression process was 15 ato. The press was heated at a rate of 5° C./min to 170° C., which temperature was maintained for 1 hour, after which there was cooling at the same rate to 50° C., followed by the press being opened. The laminate was subjected to a 2-hour thermal aftertreatment at 200° C. The thickness of the laminate ranged from 1.4 to 1.6 mm.

The following properties were measured on the laminate:
Tg (°C.) DMA: 205° C. TMA: 170° C. DSC: 175° C.

Pressure Cooker Test

Water absorption (%) Test passed?
   after 2 hr: 0.25 yes
   after 4 hr: 0.35 yes
   after 7 hr: 0.45 yes Percentage of water absorption: 0.1%

Absorption of dichloromethane: 0.9%

Absorption of N-methyl pyrrolidone: 0.05%

Copper peel strength:
   as received: 13 N/cm
   after solder float: 13 N/cm
   delamination: after > 10 minutes of solder float Dielectric properties (measured on a laminate having a thickness of 1.44 mm, with previous drying of the sample)

| frequency (MHz) | dielectric constant | loss factor |
|---|---|---|
| 0.1 | 4.4 | 0.0084 |
| 0.1 | 4.4 | 0.0089 |
| 1 | 4.3 | 0.0119 |
| 2 | 4.4 | 0.0109 |
| 10 | 4.2 | 0.0120 |
| 20 | 4.2 | 0.0119 |
| 50 | 4.2 | 0.0177 |

Examples 7 through 11

In the same manner as described in Examples 1 through 6 a series of samples having an equivalent percentage of 50 instead of 90 was prepared. The composition and the Tg-values are compiled in Table 2.

TABLE 2

[Tg-measurements on the samples described in Examples 7 through 11]
SMA3000
equivalent percentage 50%
0.010% of 2-methyl imidazole

| example no. | 7 | 8 | 9 | 10 | 11 |
|---|---|---|---|---|---|
| composition: | | | | | |
| % FR-4 resin | 71.1 | 69.0 | 67.5 | 64.0 | 56.9 |
| % SMA3000 | 28.9 | 28.0 | 27.5 | 26.0 | 23.1 |
| % TAC | 0 | 3.0 | 5.0 | 10.0 | 20.0 |
| Tg (°C.) | 104 | 116 | 125 | 142 | 152 |
| TMA-method | | | | | |

Examples 12 through 14

These examples relate to laminates prepared in a manner analogous to the one disclosed in Example 6, except that this time use was made of SMA1000 in the following equivalent percentages: 50, 70, and 110%. The properties of these laminates are compiled in Table 3.

TABLE 3

[properties of the laminates described in Examples 12 through 14]

| example no. | 12 | 13 | 14 |
|---|---|---|---|
| composition: | | | |
| % FR-4 resin | 75.0 | 70.3 | 62.6 |
| % SMA1000 | 15.0 | 19.7 | 27.4 |
| % TAC | 10.0 | 10.0 | 10.0 |
| equivalent-% | 50 | 70 | 90 |
| Tg (°C.) | | | |
| TMA | 120–125 | 125–135 | 165–170 |
| DSC | 120–125 | 130–135 | 150–155 |
| Pressure Cooker Test | | | |
| Water absorption | | | |
| after 2 hours: | $0.34_1$ | $0.35_1$ | $0,46_2$ |
| after 4 hours: | $0.47_1$ | $0.49_1$ | $0,51_2$ |
| after 7 hours: | $0.60_1$ | $0.61_2$ | $0,60_2$ |
| % water absorpt.: | .01 | 0.1 | 0.1 |
| % $CH_2Cl_2$ absorpt.: | 0.4 | 0.6 | 0.6 |
| % NMP adsorpt.: | 0.05 | 0.1 | 0.1 |
| Copper peel strength | | | |
| as received: | 15 N/cm | 15 N/cm | 17 N/cm |
| aft. solder float: | 15 N/cm | 15 N/cm | 16 N/cm |
| delamination after solder float: | >10 min | >10 min | >5 min |

$_1$Test passed
$_2$Test not passed

Example 15

In Example 15 the laminate concerned is an epoxy cresol Novolac (code ECN1280) cured with a combination of SMA3000 and tetrabromobisphenol-A (abbreviation: TBBPA). The equivalent percentage of the two cross-linking groups combined is 90%. The composition and properties are as follows:
Composition:
   ECN 1289: 45.0%
   SMA 3000: 9.4%
   TBBPA: 35.5%
   TAC: 10.0%

The following properties were measured on the laminate:
Tg (°C.)
- TMA: 185° C.
- DSC: 185° C.

Pressure Cooker Test
- Water absorption Test passed?
    - after 2 hours: 0.34 yes
    - after 4 hours: 0.38 yes
    - after 7 hours: 0.46 yes
- Percentage of water absorption: 0.1%
- Absorption of dichloromethane: 0.2%
- Absorption of N-methyl pyrrolidone: 0.1%
- Copper peel strength:
    - as received: 17 N/cm
    - after solder float 17 N/cm
        - delamination: after 7–8 minutes of solder float

We claim:

1. A resin composition comprising
   an epoxy resin,
   a cross-linking agent for the epoxy resin in the form of a carboxylic anhydride which is a copolymer of an ethylenically unsaturated anhydride and a vinyl compound,
   a radical initiator, and
   triallyl cyanurate (TAC).

2. The resin composition of claim 1 wherein the TAC is present in an amount of at least 2 wt.%.

3. The resin composition of claim 1 wherein the TAC is present in an amount of at least 10 wt.%.

4. The resin composition of claim 1 wherein the radical initiator is present in an amount of between 0.01 and 5 wt.%.

5. The resin composition of claim 4 wherein the TAC is present in an amount of at least 2 wt.%.

6. The resin composition of claim 1 wherein the cross-linking agent for the epoxy resin is a copolymer of styrene and maleic anhydride having a molecular weight of about 1400 to about 50,000 and an anhydride content of 15 to 60 wt.%.

7. The resin composition of claim 6 wherein the molecular weight is about 1400 to about 2000 and a styrene:maleic anhydride weight ratio of 1:1, 2:1 or 3:1.

8. The resin composition of claim 1 wherein the copolymer is used such as to give an equivalency ratio of anhydride to epoxy in the range of 30 to 110%.

9. The resin composition of claim 1 wherein a quantity of bromine atoms such as will give fire retardancy is incorporated into the epoxy resin.

* * * * *